(12) United States Patent
Downey

(10) Patent No.: US 6,172,306 B1
(45) Date of Patent: Jan. 9, 2001

(54) SOLDER CRACKING RESISTANT I/O PIN CONNECTIONS

(75) Inventor: Karen A. Downey, Owego, NY (US)

(73) Assignee: Lockheed Martin Corporation, Bethesda, MD (US)

( * ) Notice: Under 35 U.S.C. 154(b), the term of this patent shall be extended for 0 days.

(21) Appl. No.: 09/163,405

(22) Filed: Sep. 30, 1998

(51) Int. Cl.[7] .............................. H01R 12/04; H05K 1/11
(52) U.S. Cl. .............................................. 174/261; 439/876
(58) Field of Search .................................. 174/260, 261, 174/262, 267; 361/772, 774, 782, 776, 777; 439/65, 74, 75, 83, 876, 874; 257/690, 692, 697, 734, 777, 779

(56) References Cited

U.S. PATENT DOCUMENTS

| 2,917,678 | * | 12/1959 | Tepper | 317/101 |
| 3,345,622 | * | 10/1967 | Matsushita | 365/55 |
| 4,422,128 | * | 12/1983 | Zurlinden et al. | 361/776 |
| 4,991,286 | | 2/1991 | Russo et al. | 29/840 |
| 5,311,400 | | 5/1994 | Fuchs et al. | 361/736 |
| 5,389,743 | | 2/1995 | Simila et al. | 174/262 |
| 5,514,839 | | 5/1996 | Bender | 174/262 |

* cited by examiner

Primary Examiner—Jeffrey Gaffin
Assistant Examiner—Jeremy Norris
(74) Attorney, Agent, or Firm—McGuireWoods, LLP

(57) ABSTRACT

A robust connection is made from contact pad metallization on a substrate of a modular circuit to a connection pin by solder bonding. The connection includes a flexible copper strap with an aperture at one end which is sized to fit over the connection pin. The opposite end of the strap is solder bonded to an end of the connection pin. The connection thus made avoids application of stress from pin flexure to the solder bonds to avoid cracking while providing a connection having a low profile and minimal protrusion above the modular circuit substrate.

19 Claims, 2 Drawing Sheets

SOLDER CRACKING RESISTANT I/O PIN CONNECTIONS

This invention was made with Government support under IWTA XK-34-00063 awarded by the U.S. Government. The Government has certain rights in this invention.

BACKGROUND OF THE INVENTION

1. Field of the Invention

The present invention generally relates to I/O connections (including power connections) of circuit modules and, more particularly, to improved connections to I/O pins in modular circuits which are subject to mechanical and thermal stressing.

2. Description of the Prior Art

Modular circuit designs have been known and employed in complex electronic devices for numerous applications. Modular circuit designs allow substantial convenience in packaging and manufacture as well as for repair and implementation of upgraded or improved modules which may improve the function of the overall apparatus as the improved modules become available. However, to allow realization of such advantages by modular construction of electronic apparatus, inputs and outputs, including power connections, must be made by a more-or-less readily detachable mechanical connections.

In recent years, many applications for complex electronic devices have involved particularly severe environmental circumstances. Avionics is exemplary of applications in which the structure of electronic devices may be subjected to extreme temperature excursions, acceleration, vibration and possibly even stresses transmitted from the airframe of the aircraft. Thermal excursions can also generate stresses internally of the electronic device and/or modular circuits included therein. Such stresses are, of course, carried by the structures by which the various components of the electronic device are supported, regardless of the source of the stresses. When the structures which support a component or module also make electrical connections thereto, the quality of the electrical connection may be compromised in some manner. Pin structures are particularly subject to problems of this type since they, in essence, constitute cantilevered structures which can concentrate forces at the base or other support of the pin.

In particular, flexure of pin connections which are electrically attached to a circuit substrate by soldering tends to cause cracking of the solder connection even when the pin is otherwise supported by the substrate and/or a reinforcing header to which the circuit substrate may be attached. Cracking of solder joints is particularly critical in regard to reliability of electrical apparatus since it is a progressive process which increases resistance and the potential for heating within the connection and, in severe cases could result in solder reflow including the formation of voids. Further, electrical conduction across a crack may be possible under test conditions but may result in intermittent connection or disconnection when the electronic device is placed in service, engendering noise and other signal anomalies.

Accordingly, numerous connection designs and bonding techniques have been attempted to increase reliability of electrical connections which must also carry mechanical loads. For example, welding, brazing and ultrasonic bonding are known but are expensive, generally inconvenient and require significantly more costly specialized equipment to perform. Such equipment generally is of limited throughput and can significantly reduce manufacturing productivity. More permanent connection techniques can also impede circuit or module repair unless other similarly specialized techniques, tooling and equipment are employed, of which U.S. Pat. No. 4,991,286 is exemplary.

Various connection designs are also known which often seek to provide redundant connections and/or mechanical forces which are intended to maintain electrical contact while accommodating some degree of flexure. For example, U.S. Pat. No. 5,514,839 provides for welding of a pin to metallization on a flexible circuit board in which the metallization also forms tabs which bear against the pin for welding thereto. However, this structure requires substantial pin height above the metallization of the circuit board whereas very low (e.g. 0.020 inches) pin protrusion is characteristic of modern modular circuit designs. An additional process step by which the tabs are formed into a desired shape is also required. (The same is true of U.S. Pat. No. 5,389,743 for increasing connection security but does not provide for pin mounting.) Low pin protrusion or header profile height as well as miniaturization of circuit modules limits the space and length available to accommodate pin flexure. U.S. Pat. No. 5,311,400 is directed to reduction of header profile height but uses discrete insulated wires for connections to pins.

Accordingly, it is seen that known arrangements for improving reliability of electrical connections are not readily applicable to low pin protrusion height which is desirable in modern modular circuits. Likewise, known arrangements are not generally simple or inexpensive and cannot be easily implemented in a modular circuit by solder bonding processes.

SUMMARY OF THE INVENTION

It is therefore an object of the present invention to provide a structure for connection with solder to a pin-type connection which avoids cracking of the solder with flexure of the pin.

It is another object of the invention to provide a reliable solder connection suitable for low pin protrusion and header profile height and which is simple, inexpensive and readily assembled without specialized or complex tooling or machinery.

In order to accomplish these and other objects of the invention, a connection from a connection pad metallization to a pin is provided comprising a conductive strap including an aperture sized in accordance with the pin and connected to the connection pad and an end remote from the aperture connected to an end of the pin. The connection strap may be bonded to the connection pad and to the pin by solder bonds which, by virtue of the connection strap, are substantially isolated from stresses from and movement of the pin so that cracking of the solder bonds is avoided.

BRIEF DESCRIPTION OF THE DRAWINGS

The foregoing and other objects, aspects and advantages will be better understood from the following detailed description of a preferred embodiment of the invention with reference to the drawings in which.

DETAILED DESCRIPTION OF A PREFERRED EMBODIMENT OF THE INVENTION

Figure 1:
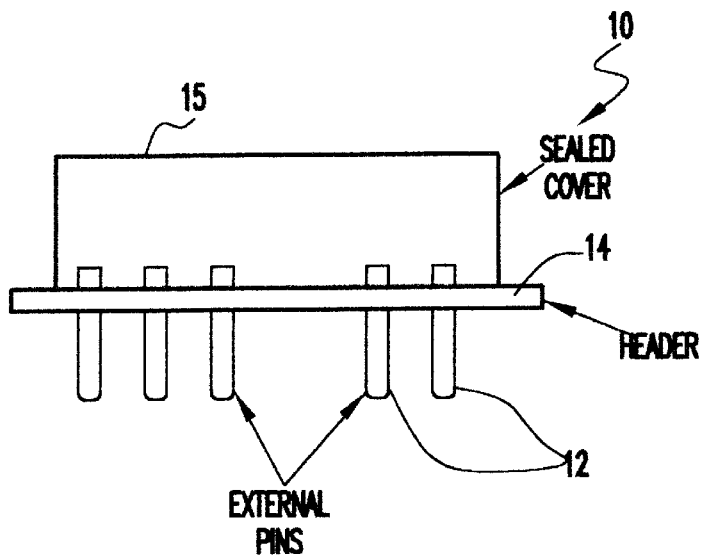
FIG. 1 is a side view of a modular circuit structure to which the invention is applicable.

Referring now to the drawings, and more particularly to FIG. 1, there is shown a side view of the exterior of an exemplary circuit module 10 to which the invention may be applied. The circuit module includes a plurality of connection pins 12 which protrude below a header 14 that provides mechanical support for the pins. Generally, the header 14 is in the form of a metal plate, including glass seals 14' (FIG. 2) to insulate the pins therefrom and to seal the module, to enhance heat transfer but neither the form nor the material are critical to the practice of the invention. A cover 15 is sealed to the top side of the header 14 for hermetically sealing the components included in the module from the environment.

Figure 2:
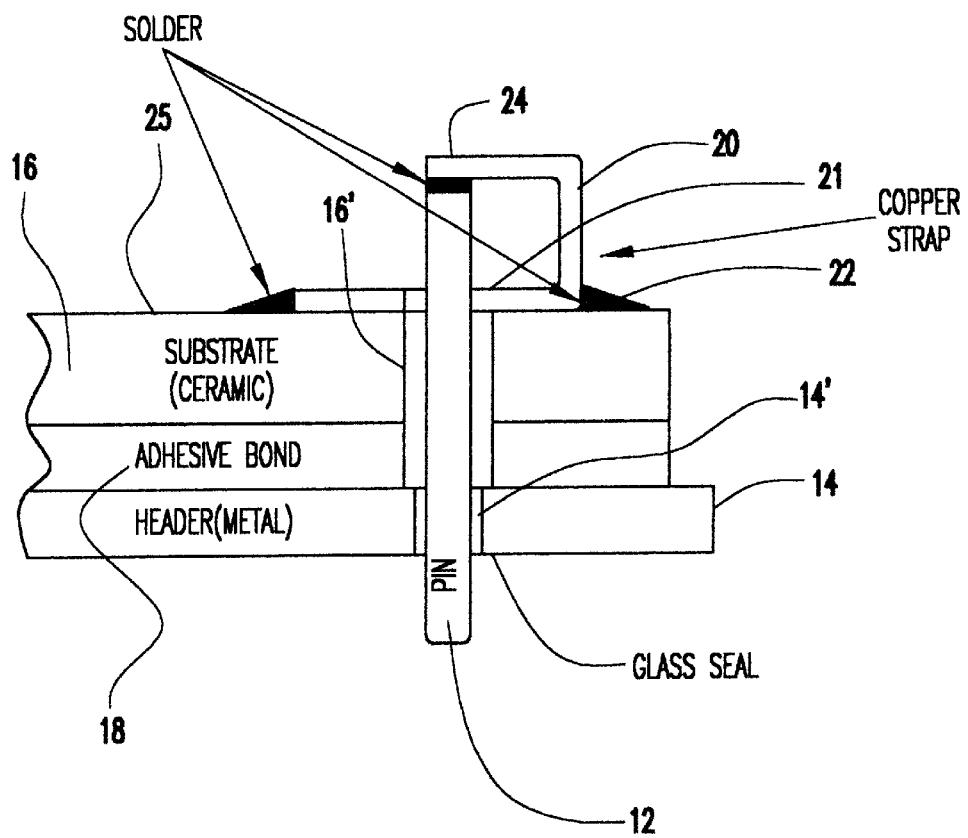
FIG. 2 is an enlarged cross-sectional view of structure in accordance with the invention at a representative pin of the modular circuit of FIG. 1.

A portion of the internal structure of module 10 adjacent an arbitrary pin 12 is shown in cross-section in FIG. 2. The internal circuitry of the module, including surface metallization schematically indicated at 25, is carried by substrate 16 which is preferably formed of a ceramic material in order to tolerate high temperatures. The material of the substrate is not otherwise important to the practice of the invention. The substrate 16 is bonded to header 14, preferably by an adhesive layer 18.

The substrate 16 (and adhesive layer 18) are fabricated with holes to accommodate the header pins 12 as shown at 16' to avoid coupling of mechanical forces from pin 12 to substrate 16 and to recess the substrate 16 from pins 12 so that the clearance 21 reduces the possibility of solder bridging from metallization on the substrate 16 to pin 12. Avoidance of application of forces to the substrate 16 from pin 12 is particularly important when the substrate is formed of a brittle material such as a ceramic since cracking or other damage to the substrate could otherwise occur due to leverage of the pin length.

Surface metallization 25 preferably includes a contact pad pattern which partially or fully surrounds a location of pin 12. This contact pad provides a connection to pin 12 which, if made by direct solder bonding to the pin, is subject to cracking due to flexure of the pin as described above.

Figure 3:
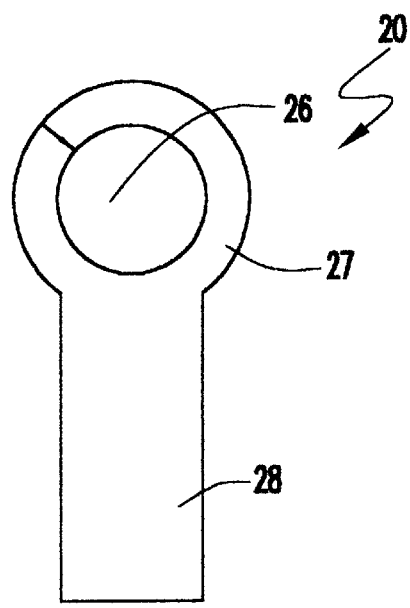
FIG. 3 is a plan view of a preferred form of a pattern for a connector in accordance with the invention.

Alternatively and in accordance with the invention, a strap 20, preferably of copper (for high conductivity and high mechanical strength), provides a simple and reliable flexible connection to pin 12. Specifically, and with reference to the strap pattern shown in FIG. 3 and the formed strap, as applied in the practice of the invention, the strap is generally in the form of an elongated rectangle having one end which includes an aperture 26 having a shape (e.g. a circle) corresponding to the diameter of the drilled hole in ceramic substrate 16 and at least partially surrounded by margin 27 such that the aperture 26 can be readily placed thereover without contacting pin 12. The aperture 26 and margin 27 are sized so that the strap does not extend beyond the outside dimensions of the corresponding circuitry (e.g. contact pad metallization) on the substrate 16.

Figure 4:
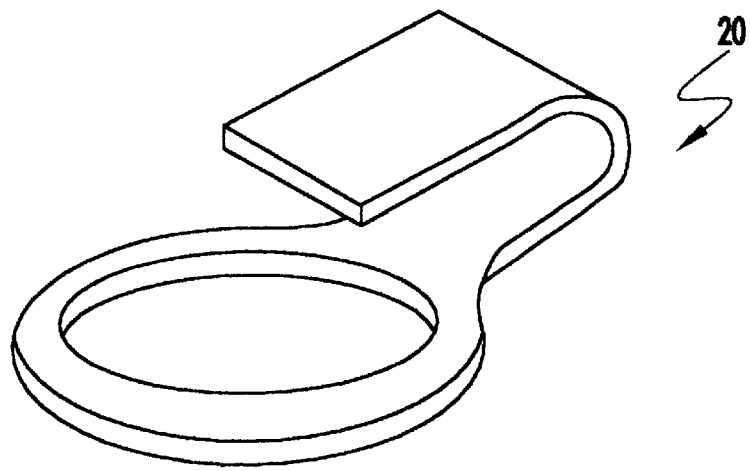
FIG. 4 is a perspective view of the connector formed as illustrated in FIG. 2.

Strap 20 is preferably formed into an arcuate "U" or "C" shape as shown in FIGS. 2 and 4 prior to installation over pin 12. However, it may be more convenient in some instances to place aperture 26 over pin 12 prior to shaping of the strap and then folding end 28 over the top or end of pin 12 after solder bond 22 is formed. End 27 of strap 20 is electrically connected to the metallization 25 on substrate 16, preferably by a solder bond 22. The opposite end is then similarly bonded to the top or end of pin 12. Both bonds 22 and 24 can be accomplished in a single operation, particularly if the shape of the strap is preformed such that the distance across the ends of strap 20 is slightly larger than the pin protrusion height above the substrate 16 to assure a force of the strap 20 against metallization 25 when end 28 of strap 20 is held against the top or end of pin 12.

It should be appreciated that substantial motion of the upper end of pin 12 can be accommodated with relatively little flexure of strap 20. Further, such flexure will be either in the direction of the smallest dimension of the strap and/or torsionally in the generally vertical central portion of the strap. Therefore, motion of the end of pin 12 is not capable of transferring significant forces to either of solder connections 22 or 24 and cracking of the solder connections is avoided. Similarly, flexure of strap 20 is maintained within its range of elastic deformation and no fatiguing of strap 20 is likely or even possible. By the same token, flexure in the direction of the width of the strap is extremely limited and the strap is thus prevented from movement which could cause shorting against other structures or straps.

In view of the foregoing, it is seen that the connection arrangement in accordance with the invention provides for mechanical isolation of pins from the substrate in modular and other forms of circuit packages which may include pin connections. Moreover, no significant forces can be transferred from pin 12 to either of solder bonds 22 or 24 and cracking thereof is avoided. Further, the connection arrangement in accordance with the invention is applicable to even very small protrusions of pin 12 above substrate 16 which need only be adequate to separate solder bonds 22 and 24.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A connection from a connection pad metallization on a substrate to a pin comprising
   a conductive strap including an aperture sized in accordance with said pin and connected to said connection pad metallization and an end remote from said aperture connected to an end of said pin.

2. A connection as recited in claim 1, wherein a clearance around said pin is provided by said aperture.

3. A connection as recited in claim 1, wherein a margin partially surrounding said aperture is sized in accordance with corresponding said connection pad metallization on said substrate.

4. A connection as recited in claim 2, wherein a margin partially surrounding said aperture is sized in accordance with corresponding said connection pad metallization on said substrate.

5. A connection as recited in claim 1, wherein said substrate is bonded to a header and said header mechanically supports said pin.

6. A connection as recited in claim 5 wherein said header is formed of metal and includes an insulating seal for supporting said pin.

7. A connection as recited in claim 6, wherein said seal is formed of glass.

8. A connection as recited in claim 1, wherein said strap is formed into an arcuate shape.

9. A connection as recited in claim 8, wherein ends of said strap formed in said arcuate shape are spaced by a distance greater than a protrusion height of said pin above said substrate.

10. A connection as recited in claim 1, wherein said strap is formed of copper.

11. A connection as recited in claim 10, wherein said strap is formed into an arcuate shape.

12. A connection as recited in claim 11, wherein ends of said strap formed in said arcuate shape are spaced by a distance greater than a protrusion height of said pin above said substrate.

13. A connection as recited in claim 10, wherein said conductive strap is connected to said connection pad metallization with solder.

14. A connection as recited in claim 10, wherein said conductive strap is connected to said end of said pin with solder.

15. A connection as recited in claim 14, wherein said conductive strap is connected to said connection pad metallization with solder.

16. A connection as recited in claim 1, wherein said strap is sized in accordance with said connection pad metallization.

17. A connection as recited in claim 1, wherein said conductive strap is connected to said connection pad metallization with solder.

18. A connection as recited in claim 1, wherein said conductive strap is connected to said end of said pin with solder.

19. A connection as recited in claim 18, wherein said conductive strap is connected to said connection pad metallization with solder.

* * * * *